(12) United States Patent
Kwong

(10) Patent No.: US 6,542,031 B2
(45) Date of Patent: Apr. 1, 2003

(54) SWITCHED IOH AND IOL CURRENT SOURCES FOR CMOS LOW-VOLTAGE PECL DRIVER WITH SELF-TIMED PULL-DOWN CURRENT BOOST

(75) Inventor: David Kwong, Fremont, CA (US)

(73) Assignee: Pericom Semiconductor Corp., San Jose, CA (US)

( * ) Notice: Subject to any disclaimer, the term of this patent is extended or adjusted under 35 U.S.C. 154(b) by 0 days.

(21) Appl. No.: 09/683,195

(22) Filed: Nov. 29, 2001

(65) Prior Publication Data

US 2003/0042980 A1 Mar. 6, 2003

Related U.S. Application Data

(63) Continuation-in-part of application No. 09/682,459, filed on Sep. 5, 2001.

(51) Int. Cl.$^7$ .................................................. H03F 3/45
(52) U.S. Cl. ................................................. 330/253; 330/9
(58) Field of Search ................................. 330/253, 9

(56) References Cited

U.S. PATENT DOCUMENTS

| | | | |
|---|---|---|---|
| 4,709,169 A | 11/1987 | Ashton et al. | 307/455 |
| 4,999,519 A | 3/1991 | Kitsukawa et al. | 307/446 |
| 5,023,488 A | 6/1991 | Gunning | 307/475 |
| 5,216,297 A | 6/1993 | Proebsting | 307/475 |
| 5,410,592 A * | 4/1995 | Wagner et al. | 379/388.03 |
| 5,495,184 A | 2/1996 | Des Rosiers et al. | 326/73 |
| 5,541,527 A | 7/1996 | Ma | 326/21 |
| 5,548,230 A | 8/1996 | Gerson et al. | 326/73 |
| 5,561,382 A | 10/1996 | Ueda et al. | 326/66 |
| 5,874,837 A | 2/1999 | Manohar et al. | 326/83 |
| 5,966,032 A | 10/1999 | Elrabaa et al. | 326/84 |
| 6,157,586 A | 12/2000 | Ooishi | 3654/205 |
| 6,191,643 B1 | 2/2001 | Nayebi et al. | 327/536 |

* cited by examiner

*Primary Examiner*—Robert Pascal
*Assistant Examiner*—Khanh Van Nguyen
(74) *Attorney, Agent, or Firm*—Stuart T. Auvinen

(57) ABSTRACT

A differential buffer/driver has a switch network that connects an IOH current source to a differential output to be drive high, and connects an IOL current source to the other differential output to be driven low. Each output can be connected to a pull-down boost current sink. A boost pulse momentarily connects a boost current sink to the differential output being driven low. The differential buffer generates a pair of boost pulses to activate the boost current for either differential output. One boost pulse is activated when one differential output is driven low, while the other boost pulse is activated when the other differential output is driven low.

20 Claims, 7 Drawing Sheets

DRIVER 50-OHM 14 50-OHM RECEIVER
VTT

SWITCHED IOH AND IOL CURRENT SOURCES FOR CMOS LOW-VOLTAGE PECL DRIVER WITH SELF-TIMED PULL-DOWN CURRENT BOOST

CROSS REFERENCE TO RELATED APPLICATIONS

This application is a continuation-in-part (CIP) of the application for CMOS Low-Voltage PECL Driver with Initial Current Boost, U.S. Ser. No. 09/682,459, filed Sep. 5, 2001.

BACKGROUND OF INVENTION

This invention relates to differential signaling drivers, and more particularly pseudo-emitter-coupled logic (PECL) drivers.

Full-voltage-swing signaling has been used to reduce power in circuits. A complementary metal-oxide-semiconductor (CMOS) output can swing from ground to the power-supply voltage, such as 0–5 or 0–3 volts. However, as signal speeds increase, unwanted electromagnetic interference (EMI) is increasingly generated, and signal quality deteriorates due to reflections, ringing, and voltage undershoot.

Reducing the voltage swing reduces these undesirable effects. However, noise margin is also reduced as the voltage swing is cut. Noise margin can be improved by using two signal wires to transmit a logical signal, rather than just one wire. Such differential signaling has been used for many years in bipolar emitter-coupled logic (ECL) systems.

More recently, the benefits of differential ECL signaling and low-power CMOS have been combined in what is known as pseudo-emitter-coupled logic (PECL). PECL uses differential signaling and current-steering through CMOS transistors. Data rates as high as 1 Giga-bit per second are desired.

FIG. 1A shows a differential signaling scheme. Driver 10 drives lines Y1, Y2 with opposite data. Current is steered among lines Y1, Y2 so that the amount of current passing through each of resistors 14 varies with the data. The I*R voltage drop across resistors 14 can be sensed by receiver 12. The other terminal of resistors 14 is connected to terminating voltage VTT.

FIG. 1B highlights the small voltage swing of differential signaling. Lines Y1, Y2 are driven to opposite states, depending on the data transmitted. The logic high level is reached when Y1 is driven to a VOH voltage, while the complement line Y2 is driven to a VOL level. For the logic low level, Y1 is driven to the VOL voltage, while the complement line Y2 is driven high to a VOH level.

To minimize EMI radiation and signal distortion, VOH and VOL are chosen to be close to each other. This minimizes the voltage swing from VOL to VOH. For example, VOL can be set to 1.66 volts, while VOH is set to 2.33 volts in systems with 3-volt supplies. The signal swing is thus reduced to about 700 mV. The terminating voltage VTT can be set to 2 volts below Vcc, or about 1.3 volts. This is below both VOH and VOL.

When 50-ohm terminating resistors are used for lines Y1, Y2, the amount of current to produce the desired VOH and VOL levels can be calculated using Ohm's law. The current switched is I=V/R=0.33v/50=6.6 mA.

The parent application, now U.S. Pat. No. 6,429,217, described a current-boosting differential amplifier. A pulse generator is used to pulse on a boost current during switching. This boost current allows the outputs to more quickly reach the desired voltage levels. Once the boost ends, current is reduced, saving power.

While useful, another variation that more closely integrates differential pre-buffering with the pulse generator is desired. A current-boosting differential amplifier that switches currents is desired. A PECL driver with low-voltage swing is desirable. A high-switching speed differential driver with low standby power is desired.

DETAILED DESCRIPTION

The present invention relates to an improvement in low-power differential drivers.

The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventor has realized that high switching speed requires high current, but low standby power requires low currents in a differential driver. To meet these divergent goals, the inventor boosts current during switching to improve switching speed, but reduces current once switching has occurred to maintain a low standby power.

Figure 1A:
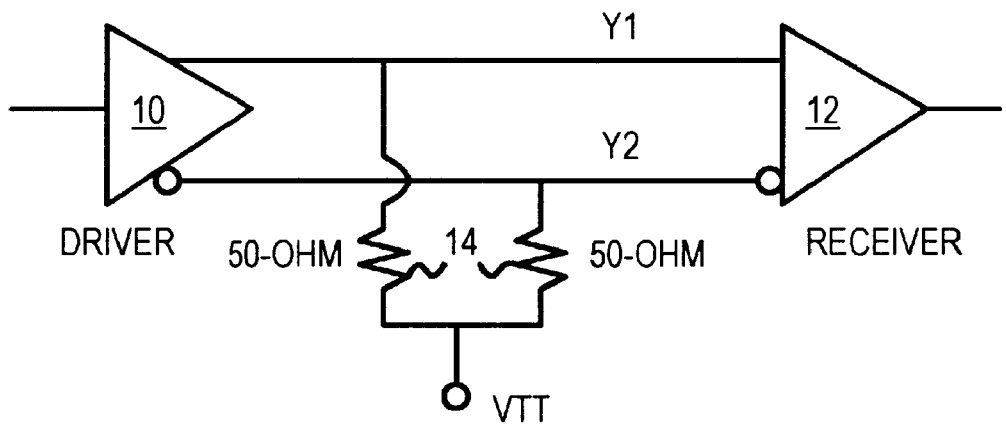
FIG. 1A shows a differential signaling scheme.
Figure 1B:
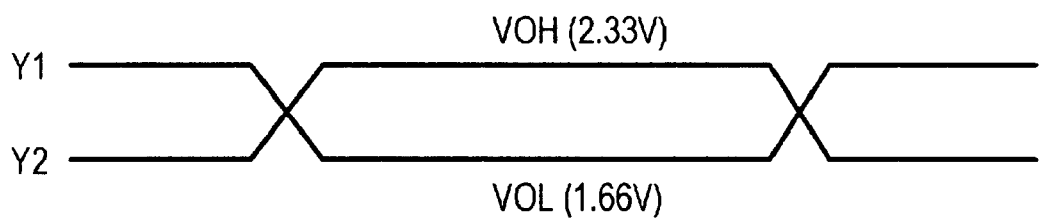
FIG. 1B highlights the small voltage swing of differential signaling.
Figure 2:
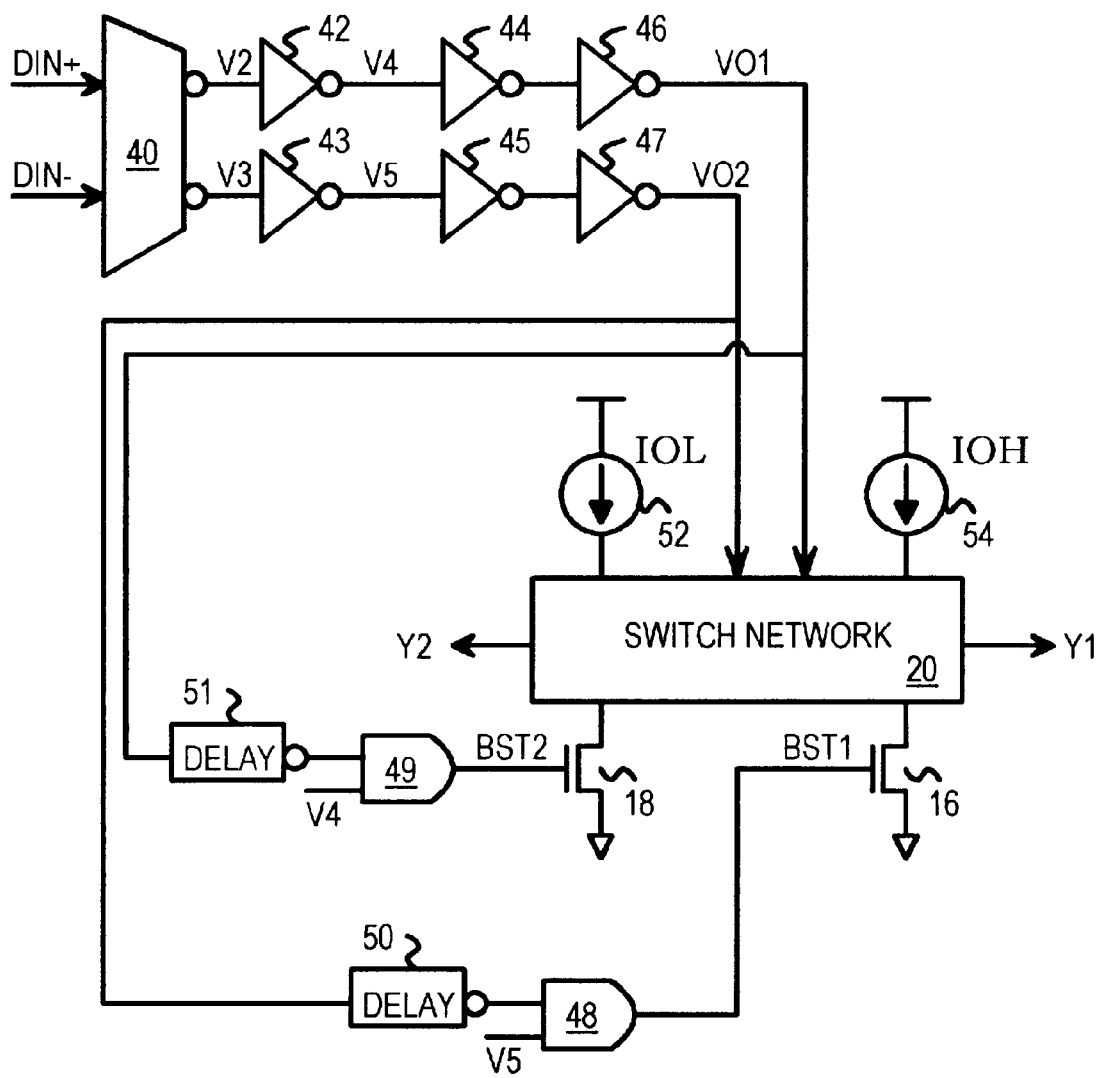
FIG. 2 is a block diagram of a current-boosting and current-switching low-voltage differential driver.

FIG. 2 is a block diagram of a current-boosting and current-switching low-voltage differential driver. Differential inputs DIN+, DIN− are applied to differential input buffer 40. The polarity is inverted to generate signal V2, which is input to inverter 42, and signal V3, which is input to inverter 43.

The output of inverter 42, signal V4, is buffered by inverters 44, 46 to generate signal VO1. The output of inverter 43, signal V5, is buffered by inverters 45, 47 to generate signal VO2.

Signals VO1, VO2 are input to switch network 20, which switches output-high IOH current source 54 to one of the outputs Y1, Y2 that is to be driven high, while the other output to be driven low has output-low IOL current source 52 switched to it. IOH current source 54 typically produces a larger current than IOL current source 52.

To more rapidly pull down the low-going output, a pull-down current boost is also generated. When output Y1 is pulled low, n-channel current-boost transistor 16 is turned on by boost signal BST1 that is applied to its gate. Activation of transistor 16 by signal BST1 produces an increased pull-down current that more rapidly pulls output Y1 low. Likewise, when output Y2 is low-going, n-channel current-boost transistor 18 is turned on by boost signal BST2 that is applied to its gate. Activation of transistor 18 by signal BST2 produces an increased pull-down current that more rapidly pulls output Y2 low.

AND gate 48 generates boost signal BST1 to the gate of n-channel current-boost transistor 16. AND gate 48 receives signal V5 from inverter 43, which initiates the boost pulse, and a delayed signal VO2 (VO2DEL) that inverting delay 50 generates.

The delayed VO2 signal ends the BST1 boost pulse.

AND gate 49 generates boost signal BST2 to the gate of n-channel current-boost transistor 18. AND gate 49 receives signal V4 from inverter 42, which initiates the boost pulse, and a delayed signal VO1 (VO1 DEL) that inverting delay 51 generates. The delayed VO1 signal ends the BST2 boost pulse.

Figure 3:
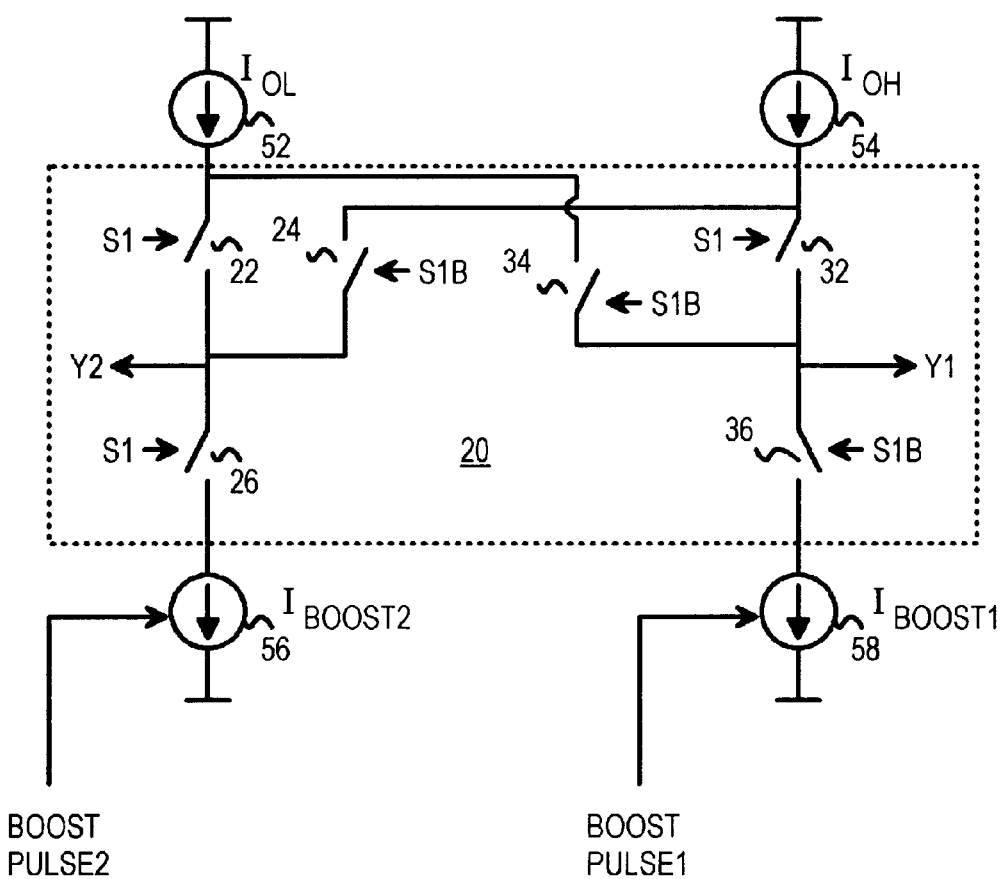
FIG. 3 shows the switch network in more detail.

FIG. 3 shows the switch network in more detail. Switch network 20 switches IOL current source 52 to either output Y1 or output Y2, depending on which output is low-going. IOH current source 54 is switched to the high-going output (Y1 or Y2).

When Y1 is high-going, and Y2 is low-going, signal S1 is high, closing switches 22, 32. Switch 22 connects IOL current source 52 to low-going output Y2, while switch 32 connects IOH current source 54 to high-going output Y1. Switch 26 also closes, connecting pull-down current boost 56 to output Y2. Pull-down current boost 56 further increases the rate of pull-down of output Y2. Switches 24, 34, 36 are open (non-conducting).

When Y1 is low-going, and Y2 is high-going, signal S1B is high, closing switches 24, 34. Switch 34 connects IOL current source 52 to low-going output Y1, while switch 24 connects IOH current source 54 to high-going output Y2. Switch 36 also closes, connecting pull-down current boost 58 to output Y1. Pull-down current boost 58 further increases the rate of pull-down of output Y1. Switches 22, 32, 26 are open (non-conducting).

Signal BST2 activates pull-down current boost 56, while signal BST1 activates pull-down current boost 58. Signals BST1, BST2 are pulsed so that pull-down current boosts 56, 58 are activated for only a short period of time. Standby power is reduced once pull-down current boosts 56, 58 are turned off.

Figure 4:
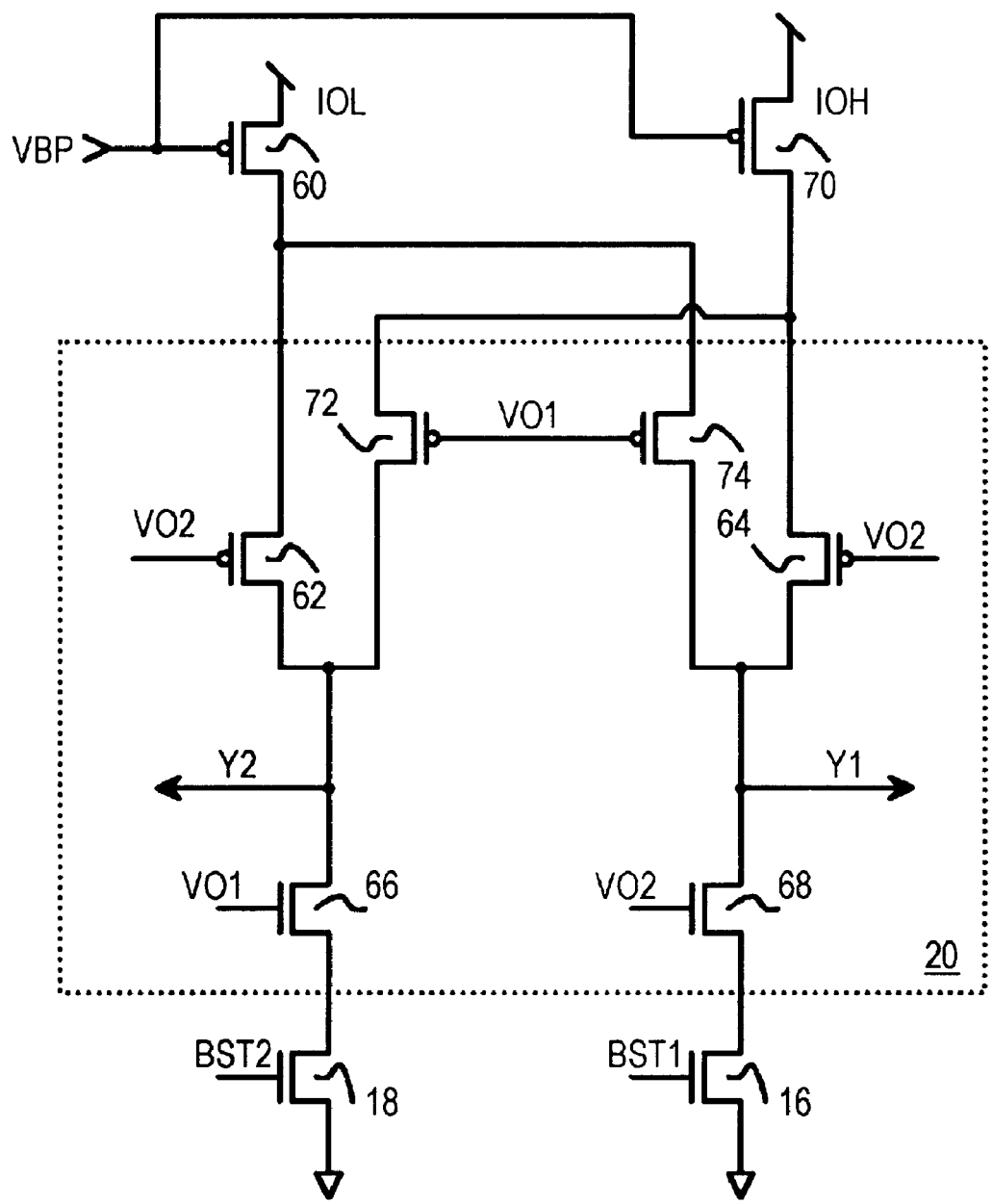
FIG. 4 is a schematic of the switch network and current sources in the differential driver.

FIG. 4 is a schematic of the switch network and current sources in the differential driver. A bias voltage VBP, is applied to the gates of p-channel current-source transistors 60. 70. This bias voltage VBP is generated by the bias-generator circuit shown in FIG. 5. Transistor 60 generates current IOL and thus acts as the IOL current source. Transistor 70 generates current IOH and acts as the IOH current source. The IOH current passing through an external or internal terminating resistance sets the output-high voltage VOH. Similarly, the IOL current passing through a terminating resistance sets the output-low voltage VOL.

When Y1 is being driven high and Y2 driven low, signal VO1 goes high and VO2 goes low. The low VO2 signal is applied to the gates of p-channel transistors 62, 64, turning them on. Transistor 62 connects current IOL to output Y2, while transistor 64 connects current IOH to output Y1.

The high VO1 signal is applied to the gate of n-channel transistor 66, turning it on. When the boost signal BST2 pulses high, current-boost transistor 18 turns on, sinking additional current from low-going output Y2 through n-channel transistors 66, 18. This pulls output Y2 low more rapidly. Once the boost pulse BST2 ends, current-boost transistor 18 shuts off, and the IOL current from p-channel transistor 60 that passes through the Y2 terminating resistor (not shown) maintains VOL.

N-channel transistor 68 remains off, so all the IOH current is sourced to output Y1. This IOH current is forced through the Y1 terminating resistor to set VOH. P-channel transistors 72, 74 remain off, since their gates are driven by VO1, which is high.

When Y1 is being driven low and Y2 driven high, signal VO1 goes low and VO2 goes high. The high VO2 signal is applied to the gates of p-channel transistors 62, 64, turning them off. However, p-channel transistors 72, 74 turn on, since signal VO1 is low. Transistor 72 connects current IOH to output Y2, while transistor 74 connects current IOL to output Y1.

The high VO2 signal is applied to the gate of n-channel transistor 68, turning it on. When the boost signal BST1 pulses high, current-boost transistor 16 turns on, sinking additional current from low-going output Y1 through n-channel transistors 68, 16. This pulls output YI low more rapidly. Once the boost pulse BST1 ends, current-boost transistor 16 shuts off, and the IOL current from p-channel transistor 60 that passes through the Y1 terminating resistor maintains VOL.

N-channel transistor 66 remains off, so all the IOH current is sourced to output Y2. This IOH current is forced through the Y2 terminating resistor to set VOH. P-channel transistors 62, 64 remain off, since their gates are driven by VO2, which is high.

Figure 5:
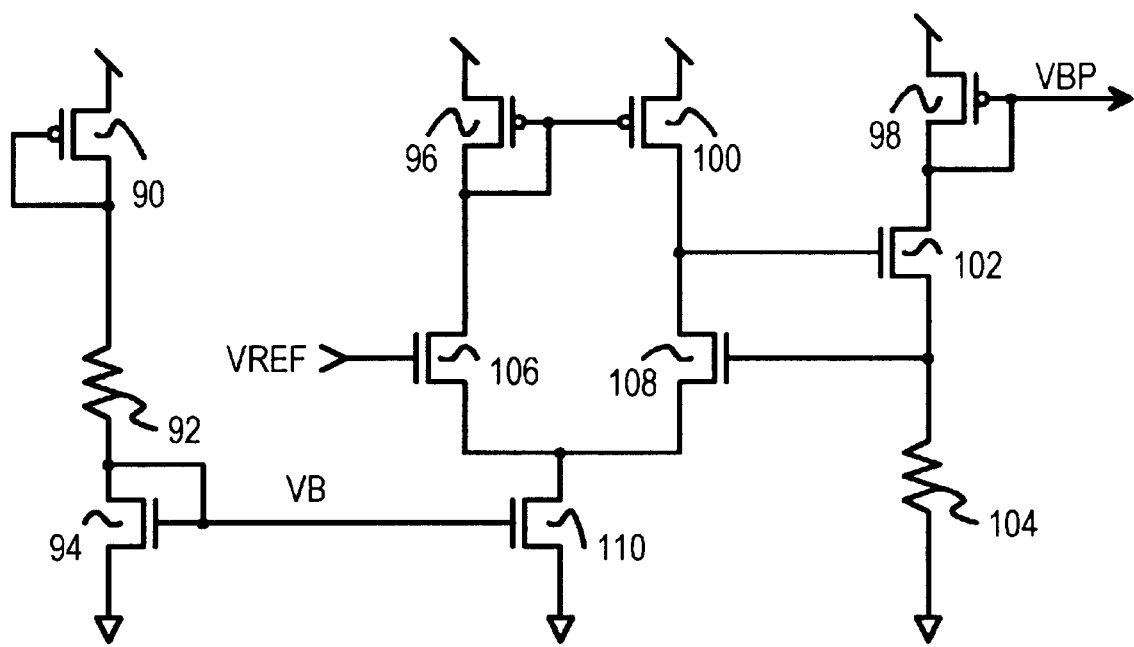
FIG. 5 is a schematic of a voltage-reference circuit that generates the bias voltage for the current sources.

FIG. 5 is a schematic of a voltage-reference circuit that generates the bias voltage for the current sources. Bias voltage VBP is generated by a voltage-divider formed by p-channel transistor 98, n-channel transistor 102, and resistor 104. The gate and drain of p-channel transistor 98 are connected together and output as the bias voltage VBP to the current source transistors 60, 70 of FIG. 4.

A comparator is formed from p-channel mirror transistors 96, 100, n-channel differential transistors 106, 108, and n-channel tail transistor 110. The gates of p-channel mirror transistors 96, 100 are connected together and to the drain of mirror transistor 96. The comparator's output is taken from the drain of mirror transistor 100 and applied to the gate of n-channel transistor 102 to adjust its transconductance (or its resistance).

A voltage reference VREF is generated and applied to the gate of differential transistor 106, and is compared with the source voltage of transistor 102 which is applied to the gate of differential transistor 108. A feedback loop from the comparator adjusts the resistance of transistor 102 until its source voltage matches the reference voltage VREF. This reference voltage can be generated by a band-gap reference or by some other reference circuit.

The tail bias VB to the gate of tail transistor 100 is generated by another voltage divider. The gate and drain of p-channel transistor 90 are connected together and to resistor 92. N-channel mirror transistor 94 is between ground and the other terminal of resistor 92. The gate and drain of n-channel mirror transistor 94 are connected together to determine tail bias VB.

Figure 6:
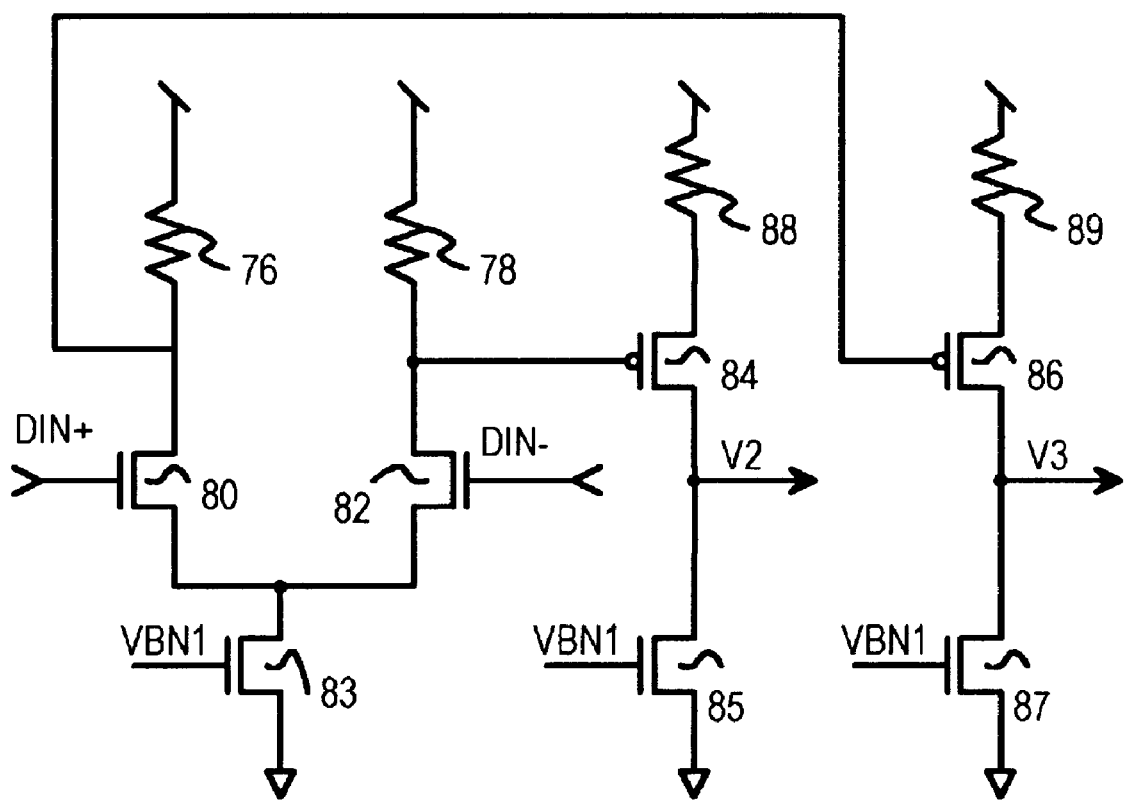
FIG. 6 is a schematic of the differential input buffer.

FIG. 6 is a schematic of the differential input buffer. Differential inputs DIN+, DIN− to differential input buffer 40 are applied to the gates of differential n-channel transistors 80, 82, respectively. Tail n-channel transistor 83 sinks current from the sources of transistors 80, 82. Resistors 76, 78 provide a current to the drains of transistors 80, 82, respectively.

The drain of differential transistor 80 is buffered by being output to the gate of p-channel transistor 86. Transistor 86 modulates the current sourced by resistor 89 and sunk by n-channel sink transistor 87. Output V3 is taken from the drains of transistors 86, 87.

The drain of differential transistor 82 is buffered by being output to the gate of p-channel transistor 84. Transistor 84 modulates the current sourced by resistor 88 and sunk by n-channel sink transistor 85. Output V2 is taken from the drains of transistors 84, 85.

When DIN+ rises above DIN−, differential transistor 80 conducts more than differential transistor 82. The drain voltage of differential transistor 80 is pulled lower than the drain of transistor 82. The lower voltage to the gate of p-channel transistor 86 increases its current drive and decreases its effective resistance. This pulls output V3 higher in voltage.

The higher drain voltage of differential transistor 82 reduces current and increases resistance of p-channel transistor 84, lowering the voltage of output V2. DIN+ is thus inverting to V2 and non-inverting to V3.

A bias voltage VBN1 is applied to the gates of n-channel transistors 83, 85, 87. This bias voltage can be generated by a bias-voltage generator or resistor-divider network.

Figure 7:
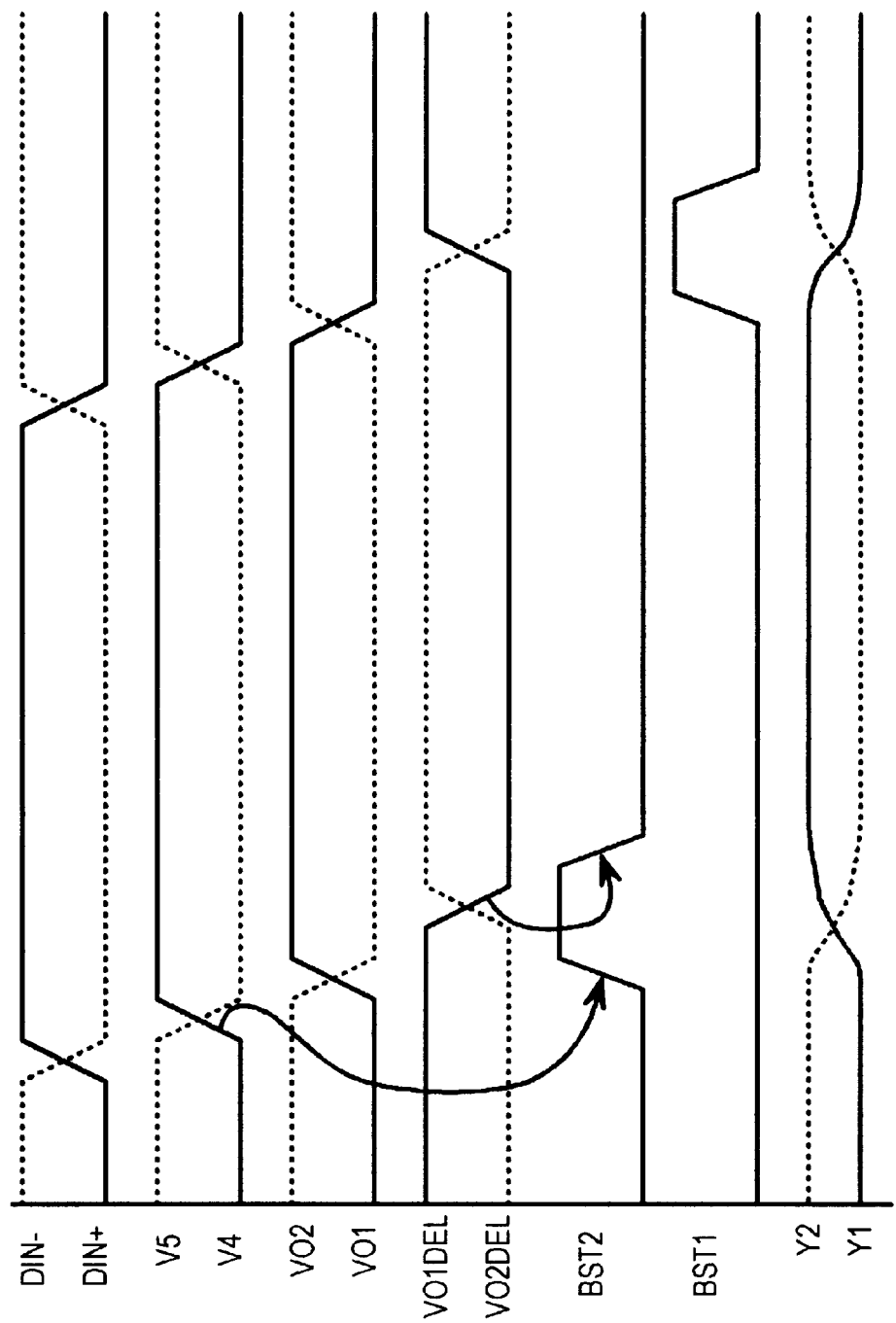
FIG. 7 is a waveform diagram illustrating operation of the differential driver.

FIG. 7 is a waveform diagram illustrating operation of the differential driver. When differential input DIN+ goes high, DIN− goes low. Signal V4 goes high and V5 goes low. After an additional delay, signal VO1 goes high and VO2 goes low. Signal VO1 is delayed by the delay buffer to generated VO1 DEL, while signal VO2 is also delayed to generate VO2DEL.

The boost pulse BST2 is initiated by signal V4 going high. Boost pulse BST2 is terminated by the delayed VO1 signal, VO1 DEL. During the BST2 pulse, output Y2 is pulled low by the additional pull-down boost current. Output Y1 rises as IOH charges the capacitances of output Y1.

When differential input DIN+ goes low and DIN− goes high, signal V5 goes high and V4 goes low. After an additional delay, signal VO2 goes high and VO1 goes low.

The boost pulse BST1 for output Y1 is initiated by signal V5 going high. Boost pulse BST1 is terminated by the delayed VO2 signal, VO2DEL. During the BST1 pulse, output Y1 is pulled low by the additional pull-down boost current. Output Y2 rises as IOH charges the capacitances of output Y2.

ALTERNATE EMBODIMENTS

Several other embodiments are contemplated by the inventor. For example, a second current boost could be added in parallel to the IOH current source to provide for a boosted pull-up current. This second boosted current source could be activated by a timed pulse. Other VOL and VOH values could be substituted, and different terminating resistance and terminating voltage can be used. Different bias voltages could be applied to the current source transistors to provide different IOH and IOL currents even if the transistors had the same W/L ratio.

Different biasing schemes can be used for generation of IOH, IOL: an off-chip resistor can be used instead of an integrated one to have more programmability and better precision for IOH and IOL. An alternative timing can be used to control the current source and the boost current sink. This scheme can also be implemented in BiCMOS technology in which precise current sources/sinks, stable biasing and reference circuitry are readily available. Additional devices, such as transistors, capacitors, and resistors can be added.

The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. 37 C.F.R. §1.72(b). Any advantages and benefits described may not apply to all embodiments of the invention. When the word "means" is recited in a claim element, Applicant intends for the claim element to fall under 35 USC §112, paragraph 6. Often a label of one or more words precedes the word "means". The word or words preceding the word "means" is a label intended to ease referencing of claims elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word means are not intended to fall under 35 USC §112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A boosted differential driver comprising:

a true differential output and a complement differential output;

an output-high IOH current source for generating an IOH current for setting an output high voltage;

an output-low IOL current source for generating an IOL current for setting an output low voltage;

a first pull-down boost current sink;

a second pull-down boost current sink; and a switch network that connects the IOH current source to the true differential output and connects the IOL current source to the complement differential output and connects the second pull-down boost current sink to the complement differential output when the true differential output is driven higher than then complement differential output, but connects the IOL current source to the true differential output and connects the IOH current source to the complement differential output and connects the first pull-down boost current sink to the true differential output when the true differential output is driven lower than the complement differential output, whereby the switch network switches the first and second pull-down boost current sinks and the IOH and IOL current sources among the true and complement differential outputs.

2. The boosted differential driver of claim 1 further comprising:
   a first boost-pulse generator for generating a first boost pulse to activate the first pull-down boost current sink during a low-going transition of the true differential output but for disabling the first pull-down boost current sink when no transition occurs; and
   a second boost-pulse generator for generating a second boost pulse to activate the second pull-down boost current sink during a low-going transition of the complement differential output but for disabling the second pull-down boost current sink when no transition occurs,
   whereby the first and second pull-down boost current sinks are pulsed on.

3. The boosted differential driver of claim 2 wherein the first pull-down boost current sink comprises a first n-channel sink transistor with a gate receiving the first boost pulse;
   wherein the second pull-down boost current sink comprises a second n-channel sink transistor with a gate receiving the second boost pulse.

4. The boosted differential driver of claim 3 wherein the IOH current source comprises a first p-channel source transistor;
   wherein the IOL current source comprises a second p-channel source transistor.

5. The boosted differential driver of claim 4 further comprising:
   a voltage-bias generator for generating a bias voltage that is applied to a gate of the first p-channel source transistor and to a gate of the second p-channel source transistor, the bias voltage not changing as the true and complement differential outputs transition.

6. The boosted differential driver of claim 5 further comprising:
   a data buffer that generates a true and a complement first intermediate signal;
   a true series of inverters, receiving the true first intermediate signal, for generating a final true signal;
   a complement series of inverters, receiving the complement first intermediate signal, for generating a final complement signal.

7. The boosted differential driver of claim 6 wherein the second boost-pulse generator receives the true first intermediate signal and the final true signal, the second boost-pulse generator initiating the second boost pulse in response to the true first intermediate signal and terminating the second boost pulse in response to the final true signal;
   wherein the first boost-pulse generator receives the complement first intermediate signal and the final complement signal, the first boost-pulse generator initiating the first boost pulse in response to the true complement intermediate signal and terminating the first boost pulse in response to the final complement signal,
   whereby the second and first boost pulses are timed by signals from the true and complement series of inverters.

8. The boosted differential driver of claim 6 wherein the data buffer comprises:
   a differential input buffer with a first output and a second output that are complements;
   a first inverter, receiving the first output and generating the true first intermediate signal;
   a second inverter, receiving the second output and generating the complement first intermediate signal.

9. The boosted differential driver of claim 7 wherein the switch network comprises:
   a true source switch that connects the IOH current source to the true differential output in response to a first switch state;
   a true crossover switch that connects the IOL current source to the true differential output in response to a second switch state;
   a complement source switch that connects the IOL current source to the true differential output in response to the first switch state;
   a complement crossover switch that connects the IOH current source to the true differential output in response to the second switch state;
   a true boost connector switch that connects the first pull-down boost current sink to the true differential output in response to the second switch state;
   a complement boost connector switch that connects the second pull-down boost current sink to the complement differential output in response to the first switch state.

10. The boosted differential driver of claim 9 wherein the first switch state is indicated by the final true signal being higher than the final complement signal;
    wherein the second switch state is indicated by the final true signal being lower than the final complement signal;
    wherein the true and complement source switches are p-channel transistors each with a gate connected to the final complement signal;
    wherein the true and complement crossover switches are p-channel transistors each with a gate connected to the final true signal.

11. The boosted differential driver of claim 10 wherein the true boost connector switch is a n-channel transistor with a gate connected to the final complement signal;
    wherein the complement boost connector switch is a n-channel transistor with a gate connected to the final true signal.

12. A current-switching differential driver comprising:
    a pair of differential outputs including a first differential output and a second differential output;
    input signal means for indicating a first state when the first differential output is to be driven to a higher voltage than the second differential output and for indicating a second state when the first differential output is to be driven to a lower voltage than the second differential output;
    low current source means for generating a low current that sets a low voltage of the pair of differential outputs;
    high current source means for generating a high current that sets a high voltage of the pair of differential outputs;
    first switch means for connecting the high current from the high current source means to the first differential output during the first state;
    second switch means for connecting the low current from the low current source means to the second differential output during the first state;
    third switch means for connecting the high current from the high current source means to the second differential output during the second state;
    fourth switch means for connecting the low current from the low current source means to the first differential output during the second state; first boost means for sinking a boost current from the first differential output at a beginning of the second state; and second boost means for sinking a boost current from the second differential output at a beginning of the first state, whereby the high current and the low current and the boost current are switched to the pair of differential outputs.

13. The current-switching differential driver of claim 12 further comprising:

differential buffer means, receiving the input signal means, for buffering true and complements of the input signal means to generate a first state signal and a second state signal;

wherein the first state signal is higher in voltage than the second state signal to indicate the first state, but the first state signal is lower in voltage than the second state signal to indicate the second state.

14. The current-switching differential driver of claim 13 further comprising:

first pulse means for generating a first pulse to activate the first boost means when the input signal means changes to the second state;

second pulse means for generating a second pulse to activate the second boost means when the input signal means changes to the first state.

15. The current-switching differential driver of claim 14 wherein the first pulse means receives a second intermediate signal from the differential buffer means to initiate the first pulse, and receives the second state signal to end the first pulse;

wherein the second pulse means receives a first intermediate signal from the differential buffer means to initiate the second pulse, and receives the first state signal to end the second pulse.

16. The current-switching differential driver of claim 15 wherein the first and second switch means each comprise a p-channel transistor that receives the second state signal at a gate;

wherein the third and fourth switch means each comprise a p-channel transistor that receives the first state signal at a gate.

17. The current-switching differential driver of claim 16 wherein the first boost means comprises a n-channel transistor with a gate that receives the second state signal;

wherein the second boost means comprises a n-channel transistor with a gate that receives the first state signal.

18. The current-switching differential driver of claim 16 wherein the low current source means and the high current source means each comprise a p-channel transistor with a gate coupled to a fixed bias voltage;

wherein the first boost means comprises a first n-channel transistor with a gate that receives the second state signal and a second n-channel transistor with a gate that receives the first pulse, the first and second n-channel transistor being in series between the first differential output and a ground;

wherein the second boost means comprises a third n-channel transistor with a gate that receives the first state signal and a fourth n-channel transistor with a gate that receives the second pulse, the third and fourth n-channel transistor being in series between the second differential output and the ground.

19. A differential driver comprising:

a first differential output and a second differential output;

a first current-source transistor coupled to conduct a first current between a power supply and a first node;

a second current-source transistor coupled to conduct a second current between the power supply and a second node;

a first source-coupling transistor coupled to conduct the first current from the first node to the first differential output;

a second source-coupling transistor coupled to conduct the second current from the second node to the second differential output;

a first source-crossover transistor coupled to conduct the second current from the second node to the first differential output;

a second source-crossover transistor coupled to conduct the first current from the second node to the second differential output;

a first boost-coupling transistor coupled to conduct a first sink current from the first differential output to a third node;

a second boost-coupling transistor coupled to conduct a second sink current from the second differential output to a fourth node;

a first boost transistor coupled to conduct the first sink current from the third node to a ground when a first boost pulse is applied to a gate of the first boost transistor; and a second boost transistor coupled to conduct the second sink current from the fourth node to the ground when a second boost pulse is applied to a gate of the second boost transistor, wherein the first current is substantially different from the second current so as to produce a voltage difference between the first and second differential outputs that are coupled to terminating resistors.

20. The differential driver of claim 19 wherein the first current-source transistor is a p-channel transistor with a gate coupled to a fixed bias voltage;

wherein the second current-source transistor is a p-channel transistor with a gate coupled to a fixed bias voltage;

wherein the first source-coupling transistor is a p-channel transistor with a gate coupled to a complement-data signal;

wherein the second source-coupling transistor is a p-channel transistor with a gate coupled to the complement-data signal;

wherein the first source-crossover transistor is a p-channel transistor with a gate coupled to a true-data signal;

wherein the second source-crossover transistor is a p-channel transistor with a gate coupled to the true-data signal;

wherein the first boost-coupling transistor is a n-channel transistor with a gate coupled to the complement-data signal;

wherein the second boost-coupling transistor is a n-channel transistor with a gate coupled to the true-data signal.

* * * * *